(12) United States Patent
Chen et al.

(10) Patent No.: US 6,667,230 B2
(45) Date of Patent: Dec. 23, 2003

(54) PASSIVATION AND PLANARIZATION PROCESS FOR FLIP CHIP PACKAGES

(75) Inventors: Dian-Hau Chen, Hsin-Chu (TW); Lin-June Wu, Hsin-Chu (TW); Kwang-Ming Lin, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 5 days.

(21) Appl. No.: 09/904,363

(22) Filed: Jul. 12, 2001

(65) Prior Publication Data

US 2003/0013291 A1 Jan. 16, 2003

(51) Int. Cl.$^7$ .......................... H01L 21/44; H01L 21/31
(52) U.S. Cl. .................. 438/613; 438/761; 438/787
(58) Field of Search .................. 438/586, 597, 438/598, 612, 613, 758, 761, 778, 787; 174/261, 263

(56) References Cited

U.S. PATENT DOCUMENTS

| | | | | |
|---|---|---|---|---|
| 5,736,456 A | * | 4/1998 | Akram | 438/614 |
| 5,767,010 A | * | 6/1998 | Mis et al. | 438/614 |
| 5,846,875 A | * | 12/1998 | Haji | 438/614 |
| 5,903,058 A | * | 5/1999 | Akram | 257/778 |
| 6,107,180 A | * | 8/2000 | Munroe et al. | 438/613 |
| 6,297,140 B1 | * | 10/2001 | Uzoh et al. | 438/612 |
| 6,300,250 B1 | * | 10/2001 | Tsai | 438/694 |
| 6,452,270 B1 | * | 9/2002 | Huang | 257/738 |
| 6,569,752 B1 | * | 5/2003 | Homma et al. | 438/597 |
| 6,586,323 B1 | * | 7/2003 | Fan et al. | 438/614 |

* cited by examiner

Primary Examiner—Kamand Cuneo
Assistant Examiner—Scott B. Geyer
(74) Attorney, Agent, or Firm—Tung & Associates

(57) ABSTRACT

A method including the step of forming contact pads on a semiconductor wafer. A passivation blanket is deposited over the semiconductor wafer and the contact pads. The passivation blanket includes three layers. A first layer of silicon dioxide is deposited over the semiconductor wafer and the contact pads. A second layer of silicon nitride is deposited over the first layer, and a third layer and final layer of silicon dioxide is deposited over the second layer. The passivated semiconductor wafer is planarized using an oxide chemical mechanical planarization method. Holes are opened in the passivation blanket down to the contact pads. An under bump metallurgy is deposited onto the contact pads and a portion of the final silicon dioxide layer. Solder is deposited onto the under bump metallurgy and reflown to form a flip chip having solder bumps.

26 Claims, 4 Drawing Sheets

PASSIVATION AND PLANARIZATION PROCESS FOR FLIP CHIP PACKAGES

FIELD OF THE INVENTION

This invention relates to a process of making a flip chip, and more particularly to a process involving a unique passivation and planarization process for making a flip chip.

BACKGROUND OF THE INVENTION

A flip chip microelectronic assembly includes a direct electrical connection of a face down (that is, "flipped") electronic components onto substrates, such as ceramic substrates, circuit boards, or carriers using conductive bump bond pads of the chip. Flip chip technology is quickly replacing older wire bonding technology that uses face up chips with the wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use of flip chip packaging has dramatically grown as a result of the flip chips advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chips can be less than 5 percent of the old technology packaging devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in three-D geometries over other flip chips or other components.

Flip chips also provide the most rugged mechanical interconnection. Flip chips when underfilled with an adhesive such as an epoxy, can withstand the most rugged durability testing. In addition to providing the most rugged mechanical interconnection, flip chips can be the low cost interconnection for high-volume automated production.

The bumps on the flip chip assembly serve several functions. The bumps provide an electrical connective path from the chip (or die) to the substrate on which the chip is mounted. A thermally conductive path is also provided by the bumps to carry heat from the chip to the substrate. The bumps also provide part of mechanical mounting of the chip to the substrate. A spacer is provided by the bumps that prevents electrical contact between the chip and the substrate connectors. Finally, the bump acts as a short lead to relieve mechanical strain between the chip and the substrate.

Despite all of these advantages, these microelectronic assemblies are very delicate structures, the design of which and the manufacturing of create difficult and unique technical problems. Continuous efforts by those working in the art are being undertaken to improve the performance, reliability and useful life of microelectronic assemblies, particularly those using flip chips. More particularly, many problems needed to be solved, and improvements made in the process steps of making flip chips.

Some of the difficulties associated with accurately and reliably placing solder bumps on a wafer stem from the wafer fabrication processes. Wafer fabrication involves film deposition and growth processes, followed by repeated patterning to form device and interconnection structures. Advance integrated circuits require multiple levels of metallization, sometimes eight or more layers with each metal layer separated by in interlayer dielectric. As a result of multilevel interconnect wiring and device structures at different locations within the wafer, a number of different steps are created in the different layers. Wafer topography describes the nonplanar surface of the wafer layers, produced during the wafer manufacturing processes. Wafer topography becomes more pronounced with each additional layer. Acceptable step coverage and gap-fill are critical for chip yield and long-term reliability.

Higher chip packing density demands have resulted in increased topography of wafers. The desire for multilevel metal technology in integrated chip design is compounded by the ever present need to decrease the device size and interconnection dimensions. Surface topography in many advanced integrated circuits have deep steps and higher aspect ratios for gaps, making step coverage and gap fill much more difficult. A major negative consequence of topography is a loss of line width control during photolithography. Photoresist thickness variations due to topography inhibit submicron photolithography. It is also much more difficult to pattern nonuniform photoresist thickness over etched steps. Some of these factors greatly impact the ability to effectively and reliably place bumps on a wafer.

Planarization is one method of addressing or overcoming the negative impact of topography created in the multilevel wafer fabrication process. A planarized wafer has a flat surface with minimal layer thickness variation, that is, minimal topography on each layer. Filling in low features or removing high features are two ways to planarize a wafer surface. Planarizing the wafer surface is critical for follow-on process steps such as lithography and can actually serve to increase device yield by removing undesirable foreign material on the wafer surface during the actual planarization process.

In general, there are four different types of wafer planarization. In smoothing planarization, step height corners are rounded and side walls sloped, but the height is not significantly reduced. In partial planarization, the step corners are also rounded and side walls sloped, plus a local reduction in step height is achieved. In local planarization, small gaps (1–10 micrometers) are completely filled on local areas within the die, but the total step height across the wafer is not significantly reduced. In global planarization, local planarization is achieved plus significant reduction in the total step height across entire wafer surface is accomplished. This is also referred to as uniformity.

There have been three traditional methods of wafer planarization including: etchback, glass reflow, and spin on films. A topography created by surface features can be smoothed by applying a thick layer of a dielectric or other material followed by the application of the sacrificial layer of planarization material, such as a photoresist or spin on glass. The sacrificial material fills voids and low spots on the surface. Etching of the sacrificial layer is usually done by a dry etch to smooth the surface features and remove high features at a faster rate than lower features. This processes known as etchback planarization. The etching is continued until the dielectric reaches a final thickness, with the planarizing material still filling the low areas. There are different variations of etchback planarization depending on the features and metal layers used. Etchback planarization is a local planarization of topography that smooths the surface over closely spaced steps. However, etchback does not provide global planarization.

Borophosphosilicate glass (BPGS) and other doped oxides have been used for interlayer dielectric applications, and are often deposited with atmospheric pressure chemical vapor deposition. Glass reflow is the heating of a doped oxide to cause the material to flow at elevated temperatures. For example, borophosphosilicate glass annealed in a high temperature furnace at about 850° C. for 30 minutes in nitrogen causes the borophosphosilicate glass to flow. This results in the borophosphosilicate glass flowing at angles of about 20° over step coverage. The flow property can be used to achieve conformality in step coverage or gap fill and results in some measure of partial planarization around the features. Borophosphosilicate glass reflow for conformality over features attains partial planarization.

Spin on films is the application of different types of liquid materials on wafer surfaces and spinning the material to achieve planarization. This is used primarily for interlayer dielectric. Centrifugal forces are used to spin the material to fill in low features and attain a smoothing effect over topography. The planarizing capability of the spin on solution depends on a variety of factors such as the chemical composition of the solute, molecular weight, and viscosity. Typically spin on films have been either organic or inorganic, including photoresist, spin on glass, and a variety of types of resins. Spin on glass has different formulations such as 80 percent solvent and 20 percent silicon dioxide, or inorganic spin on resin formulation that includes polysiloxane. A bake step after spinning evaporates solvents and leaves oxide to fill in low-lying areas. An oxide layer is deposited by chemical vapor oxidation to further fill in gaps in the topography. However, these traditional planarization methods have been limited in their ability to achieve global planarization for multilevel semiconductor technologies.

More recently, chemical mechanical planarization has gained wide popularity in the semiconductor manufacturing industry. Chemical mechanical planarization is a global surface planarization method. The method planarizes the surface of the wafer by relative motion between the wafer and a polishing pad with the use of a slurry and applied pressure between the wafer and polishing pad. Those skilled in the art often refer to the chemical mechanical planarizing tool has a polisher. Typically, a wafer is positioned in a wafer holder or carrier, and pressed against a polishing pad which is held on the surface known as platen. Most polishers use either rotary or orbital motion, and in some cases the platen is powered and moves or rotates, while in other cases the wafer carrier is powered. Chemical mechanical planarization achieves wafer planarity by removing high features on the surface more quickly than it removes low features. Chemical mechanical planarization method can polish both dielectric and metal layers and multilayer metalization interconnect structures when the appropriate slurry and pad are utilized.

Planarity and uniformity are two terms used to express the effectiveness of the chemical mechanical planarization method. Planarity describes surface topography variations for wafer distances ranging from micrometers to millimeters. Uniformity is measured over millimeters or centimeters and represents a film thickness variation across entire wafer. As such, a wafer can be planar but nonuniform or uniform but nonplanar. For example, two specific regions on wafer could be planarized very flat but within each wafer surface region planarized to a different thickness.

The chemical mechanical planarization method uses two mechanisms to planarize the wafer surface: (1) a chemical reaction between the slurry and the wafer surface layer forms a layer that is relatively easy to remove, and (2) the reacted surface layer is mechanically removed by the slurry's abrasive components and the applied pressure and velocity of the polishing pad. Thus the technique uses both chemical reaction and mechanical action to planarize the wafer. The use of the slurry avoids damage to the wafer surface such as gouges and scratches that might occur with a purely mechanical process.

Oxide polish was one of the first chemical mechanical planarization processes used in the semiconductor wafer fabrication industry. Oxide polishing is used typically to planarizes deposited interlayer dielectrics between metal layers to achieve global planarity. In a basic slurry, the water in the slurry reacts with the oxide to form a hydroxyl bond. This is referred to as surface hydration. Surface hydration of the oxide decreases its hardness, mechanical strength and chemical durability. Furthermore, during the chemical mechanical planarization process the wafer surface is heated due to friction created during the polishing which warms the hydrated surface making it softer.

The slurry used in the chemical mechanical planarization process is a mixture of fine abrasive particles and chemicals that are used to remove specific materials from the wafer surface during chemical mechanical planarization. The slurry is sometimes dispensed through a slurry dispensing nozzle onto the platen. Precise slurry mixing and consistent batch blends are critical to achieve the necessary repeatability from wafer to wafer, and from day-to-day. It is also important for the slurry to be uniformly dispersed across wafer surface during the process. One common type of slurry is the oxide slurry which includes oxide dielectrics such as ultrafine silica colloidal particles in an alkaline medium of aqueous potassium hydroxide or ammonium hydroxide.

Recently, benzocyclobutene has been used as a passivation and planarization material. Benzocyclobutene is often selected due to its low curing temperature, rapid thermal curing, low water absorption, compatibility with copper and good adhesion properties. Further, benzocyclobutene is relatively environmentally friendly because there are no byproducts other than water that are created during the curing process. Benzocyclobutene material has been used with copper interconnect semiconductor devices and sub 0.25 micron devices due to its low dielectric constant (K). When utilized for making a flip chip, holes are opened in the benzocyclobutene to an underlying contact pad such as aluminum or copper. Thereafter, an under bump metallurgy is deposited onto the contact pad and over a portion of the benzocyclobutene. Finally, solder is deposited onto the under bump metallurgy and reflown to form a solder ball. However, it is difficult to control the deposition of the under bump metallurgy onto the benzocyclobutene layer.

Thus it would be desirable to provide a new passivation and planarization method which allowed for accurate and controllable deposition of the under bump metallurgy followed by subsequent deposit of a contact material such as solder onto the under bump metallurgy. The present invention overcomes deficiencies in the prior art, and provides advantages over and alternatives to the prior art.

SUMMARY OF THE INVENTION

One embodiment of the present invention includes a method including the step of providing a semiconductor wafer having at least one contact pad thereon. A passivation blanket is deposited on the semiconductor wafer and contact pad to provide a passivated wafer. The passivated wafer undergoes chemical mechanical planarization. Holes are opened in the planarized wafer down to the contact pads. An under bump metallurgy is deposited onto the contact pads and a contact material is deposited onto the under bump metallurgy.

Another embodiment of the invention includes in method of providing a semiconductor wafer having at least one contact pad thereon. A passivation blanket is deposited onto the semiconductor wafer and contact pads. The step of depositing the passivation blanket includes depositing a plurality of layers of material including a final layer of silicon dioxide to provide a passivated wafer. The passivated wafer is chemical mechanical planarized. Holes are opened in the passivated wafer down to the contact pads. An under bump metallurgy is deposited onto the contact pads and a contact material is deposited onto the under bump metallurgy.

In another embodiment of the invention, the contact material includes solder.

Another embodiment of the invention includes the step of reflowing the solder to provide a solder bump.

In another embodiment of the present invention, the contact material is at least one selected from the group consisting of gold, copper, aluminum, nickel, and solder.

In another embodiment of the present invention, the final layer consists essentially of silicon dioxide.

In another embodiment of the present invention the final layer of silicon dioxide is deposited by plasma assisted chemical vapor deposition.

In another embodiment of the present invention, the step of depositing a plurality of layers of materials includes depositing a silicon nitride layer.

In another embodiment of the present invention, the step of depositing a plurality of layers of materials includes depositing a silicon oxynitride layer.

In another embodiment of the present invention, the step of depositing a passivation blanket includes depositing a first layer including silicon dioxide over the semiconductor wafer and contact pad, depositing a second layer over the first layer, and depositing a third layer including silicon dioxide over the second layer.

In another embodiment of the present invention, the second layer includes silicon nitride.

In another embodiment of the present invention, the first and second layers are deposited by high-density chemical vapor deposition and the third layer is deposited by plasma assisted chemical vapor deposition.

In another embodiment of the present invention the step of chemical mechanical planarizing the passivated wafer includes globally planarizing the passivation wafer.

In another embodiment of the present invention the step of chemical mechanical planarizing the passivation wafer includes the step of applying pressure to the passivated wafer using a polishing pad in the presence of an oxide slurry.

In another embodiment of the present invention, the oxide slurry includes ultrafine silica colloidal particles in an alkaline medium of aqueous potassium hydroxide or ammonium hydroxide.

In another embodiment of the present invention the step of opening holes in the planarized wafer down to the contact pads includes etching the passivation blanket on the semiconductor wafer.

Another embodiment of the present invention includes a method of providing a semiconductor wafer and forming at least one contact pad on the semiconductor wafer. A first layer of silicon dioxide is deposited over the silicon wafer and the contact pad. A layer of silicon nitride is deposited over the first layer of silicon dioxide. A second layer of silicon dioxide is deposited over the layer silicon nitride. The semiconductor wafer, including at least the second layer of silicon dioxide, is planarized using an oxide chemical mechanical planarization step. A hole is opened in the second layer of silicon dioxide, layer of silicon nitride, and first layer of silicon dioxide down to the contact pad on the semiconductor wafer. An under bump metallurgy is deposited onto the contact pad and solder deposited onto the under bump metallurgy.

Another embodiment of the present invention further includes the step of depositing the under bump metallurgy onto a portion of the second layer of silicon dioxide.

In another embodiment of the present invention the step of depositing solder includes stencil printing solder onto the under bump metallurgy.

Another embodiment of the present invention further includes the step of reflowing the solder to form a solder bump on the semiconductor wafer.

Another embodiment of the present invention includes the step of providing a semiconductor wafer having at least one contact pad. A passivation blanket is deposited over the semiconductor wafer and contact pad, and wherein the step of depositing the passivation blanket includes depositing a plurality of layers of materials including a final layer including silicon dioxide to provide a passivated wafer. The passivated wafer is chemical mechanical planarized. A hole is opened in the planarized wafer down to the contact pad. A contact material is deposited over the contact pad.

Another embodiment of the invention includes a method of providing a semiconductor wafer having at least two metal interconnect layers and a benzocyclobutene based dielectric material between the two metal interconnect layers, and having at least one contact pad. The passivation blanket is deposited over the semiconductor device and the contact pad and the step of depositing a passivation blanket includes depositing a plurality of layers of material including a final layer comprising silicon dioxide to provide a passivated wafer. The passivated wafer is chemical mechanical planarized. Holes are opened in the planarized wafer down to the contact pad. An under bump metallurgy is deposited onto the contact pad, and a contact material is deposited onto the under bump metallurgy.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Figure 1A:
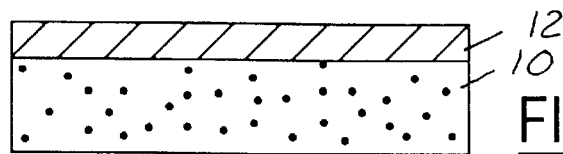
FIG. 1A illustrates a step of depositing photoresist on a semiconductor wafer according to the present invention.
Figure 1B:
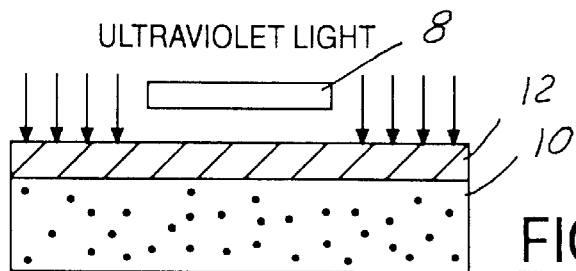
FIG. 1B illustrates the step of selectively exposing and developing portions of the photoresist.
Figure 1C:
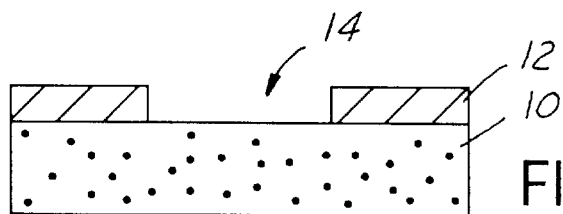
FIG. 1C illustrates the step of removing the unexposed photoresist according to the present invention.
Figure 1D:
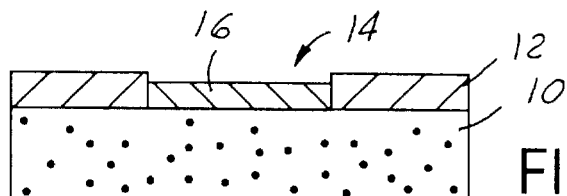
FIG. 1D illustrates the step of depositing a metal contact pad on the semiconductor wafer in the opening formed in the photoresist according to the present invention.
Figure 1E:
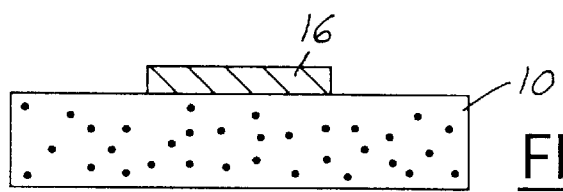
FIG. 1E illustrates the step of removing the exposed photoresist according to the present invention.
Figure 1F:
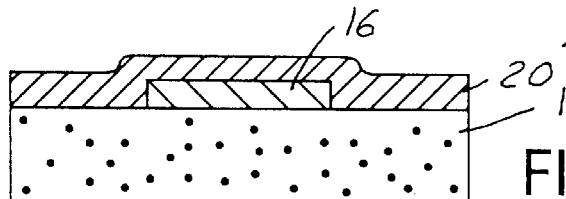
FIG. 1F illustrates the step of depositing a first layer of a passivation blanket on the semiconductor wafer according to the present invention.
Figure 1G:
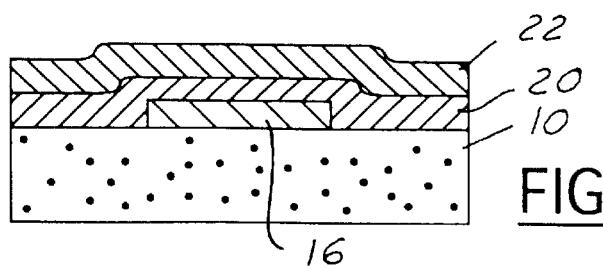
FIG. 1G illustrates the step of depositing a second layer of the passivation blanket according to the present invention.
Figure 1H:
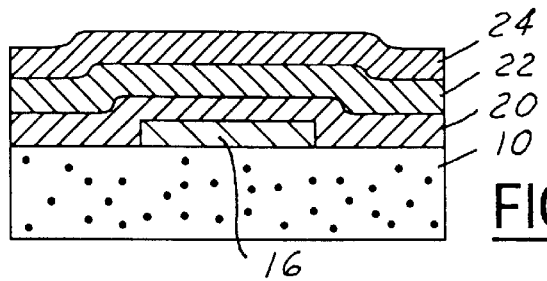
FIG. 1H illustrates the step of depositing a silicon dioxide layer as a third layer of the passivation blanket according to the present invention.
Figure 1I:
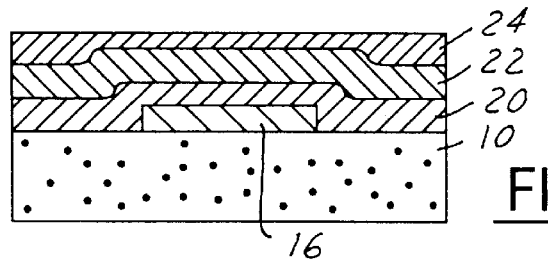
FIG. 1I illustrates the step of planarizing the passivation blanket according to the present invention.
Figure 1J:
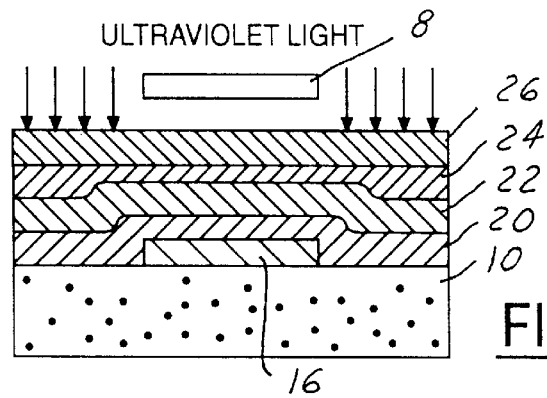
FIG. 1J illustrates the step of depositing photoresist onto the passivation blanket and selectively exposing portions of the photoresist according to the present invention.
Figure 1K:
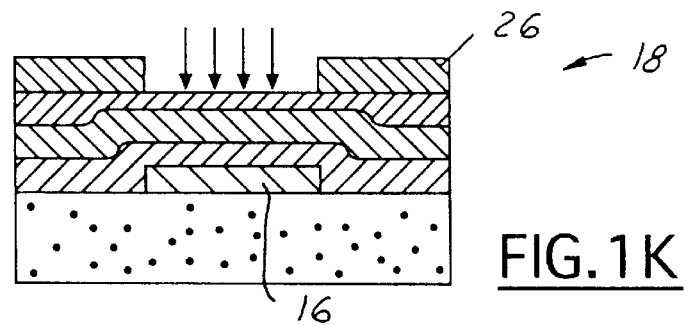
FIG. 1K illustrates the step of selectively etching a portion of the passivation blanket to form an opening down to the contact pad according to the present invention.
Figure 1L:
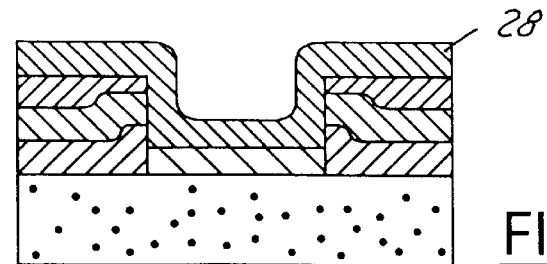
FIG. 1L illustrates the step of depositing an under bump metalization onto the upper surface of the semiconductor wafer according to the present invention.
Figure 1M:
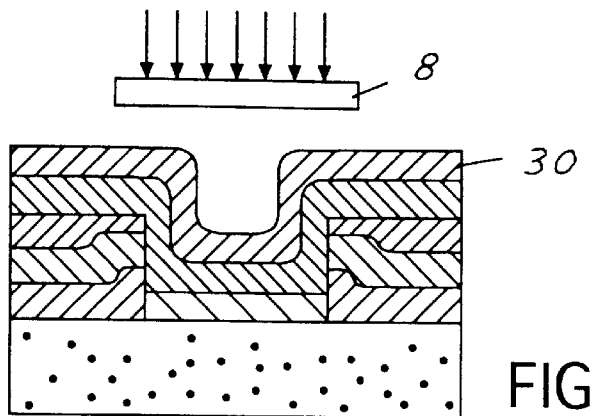
FIG. 1M illustrates the step of depositing a photoresist layer of over the under bump metalization and selectively exposing and developing a portion of the photoresist layer according to the present invention.
Figure 1N:
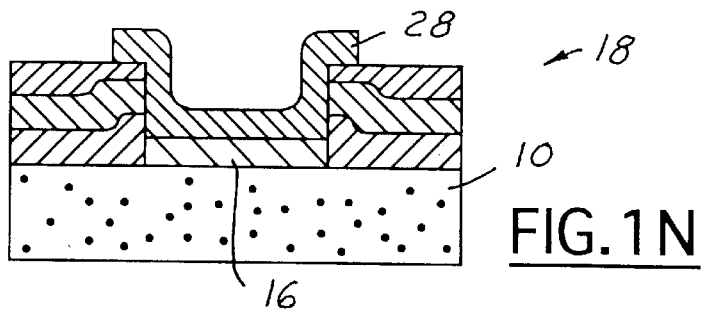
FIG. 1N illustrates the step of removing the unexposed portions of the photoresist layer and etching away portions of the under bump metallurgy not masked by the developed photoresist according to the present invention.
Figure 1O:
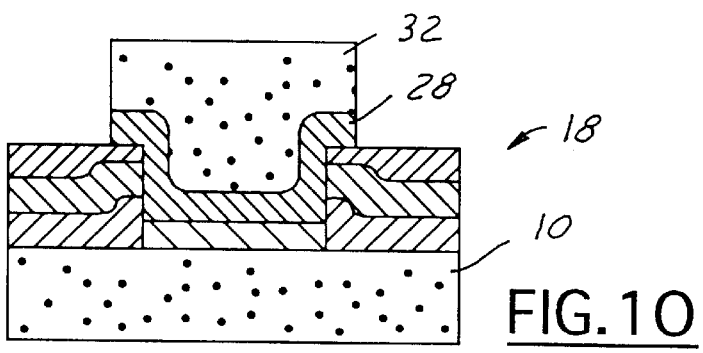
FIG. 1O illustrates the step of depositing solder onto the under bump metallurgy.
Figure 1P:
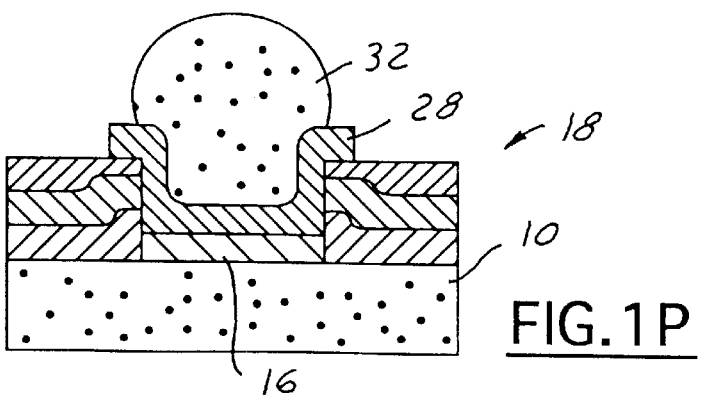
FIG. 1P illustrates the step of reflowing the deposited solder to form a solder ball.

FIGS. 1A–P illustrate a process according to the present invention. A layer of photoresist 12 is deposited onto a semiconductor wafer 10. The photoresist layer 12 is selectively exposed and developed by ultraviolet light. The unexposed photoresist is removed leaving an opening 14 in the developed photoresist layer 12 down to the semiconductor wafer 10. A contact pad 16 is deposited into the opening 14 in the photoresist layer 12. The contact pad 16 may be deposited in any manner known to those skilled in the art and may be composed of any suitable material such as copper, aluminum, a copper aluminum alloy or other suitable material for making electrical contact. Thereafter, the exposed and developed portion of the photoresist layer 12 is removed by etching or the like.

As shown in FIGS. 1F–H, a passivation blanket 18 is deposited over the upper surface of the semiconductor wafer 10 and the contact pad 16. The passivation blanket 18 may consist of a single layer or multiple layers. Preferably the passivation blanket 18 includes a first layer 20 including primarily silicon dioxide. The silicon dioxide can be deposited onto the upper surface of the semiconductor wafer in any number of ways. Typically the silicon dioxide is deposited using chemical vapor deposition. Chemical vapor deposition is a process of depositing a solid film on a wafer surface using a chemical reaction of a gas mixture. The wafer surface or the surrounding environment is heated in order to provide additional energy to the system and drive the reactions. Chemical vapor deposition may involve a chemical reaction such pyrolysis, photolysis, reduction, oxidation or reduction-oxidation. The silicon dioxide may be deposited by atmospheric pressure chemical vapor deposition. The silicon dioxide may be deposited by oxidizing silane ($SiH_4$) with oxygen. Pure silane is highly pyrophoric. Therefore, it is commonly supplied in low dilution of about 2–10 percent by volume in an inert gas such as argon or nitrogen. The reaction may be carried out at a low temperature of 450–500° C. Alternatively the silicon dioxide may be deposited using TEOS tetraethyloryhosilicate ($Si(C_2H_5O)_4$) with ozone. TEOS is an organic precursor and usually is carried by a gas such as nitrogen. Because ozone is so reactive the process can be carried out at low temperatures, for example at 400° C. without plasma.

The silicon dioxide may also be deposited by low pressure chemical vapor deposition. Typically the silicon dioxide is deposited by a process of TEOS with or without oxygen at low pressure and a temperature between 650–750° C. The silicon dioxide also may be deposited by plasma assisted chemical vapor deposition or plasma enhanced chemical vapor deposition. In plasma enhanced chemical vapor deposition the silicon dioxide is deposited by reacting silane with either oxygen, nitrous oxide, or carbon dioxide in the plasma usually at a processing temperature of about 300° C. Most preferably however, the silicon dioxide is deposited using high-density plasma chemical vapor deposition. In high-density plasma chemical vapor deposition the plasma is a high-density of the above gas mixtures at low-pressure and is directed towards a wafer surface in the reaction chamber. The deposition temperature usually ranges from about 300–400° C. To form the high density plasma, a source excites the gas mixture with RF or microwave power and directs the plasma ions into a dense range above the wafer surface.

The passivation blanket 18 may also include a second layer 22 (as shown in FIG. 1G) which is preferably made from silicon nitride or silicon oxynitride ($SiO_xN_y$). The silicon nitride may be deposited by any of a number of methods including low pressure chemical vapor deposition, plasma assisted chemical vapor deposition, plasma enhanced chemical vapor deposition and most preferably high-density plasma chemical vapor deposition. The silicon nitride may be deposited in a low pressure chemical vapor deposition process by reacting dichlorosilane with ammonia. The silicon dioxide may be deposited in plasma enhanced chemical vapor deposition by the reaction of silane with ammonia or nitrogen. To produce silicon oxynitride, $Si_3N_4$ is reacted with nitrous oxide. Most preferably, the silicon dioxide is deposited by reacting silane with ammonia or nitrogen in a high-density plasma chemical vapor deposition process.

The passivation blanket 18 may also include a third layer 24 (as shown in FIG. 1H) which preferably includes silicon dioxide. The third layer 24 may be deposited by any of the above methods but preferably the silicon dioxide is deposited by plasma enhanced chemical vapor deposition. The third layer 24 is made substantially thick in order to facilitate the chemical mechanical planarization method to be described hereafter.

Figure 2:
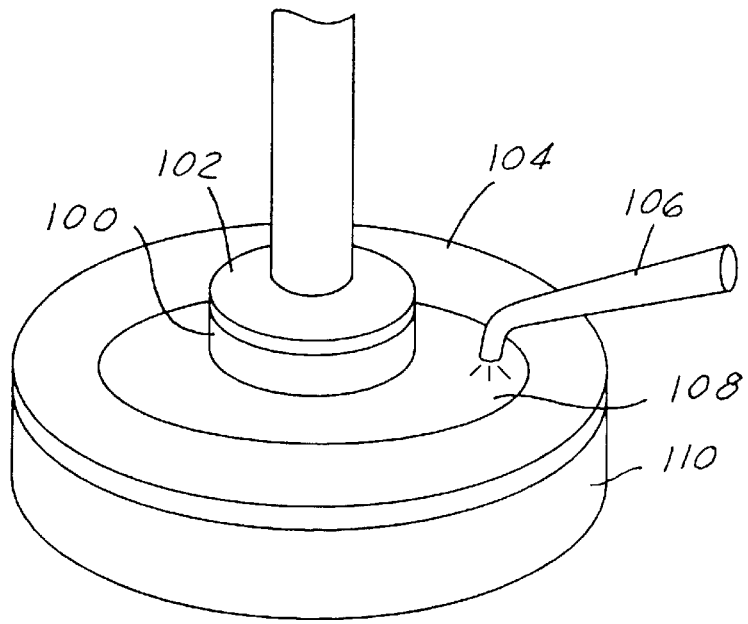
FIG. 2 illustrates an apparatus and method of the local mechanical planarization of the passivated wafer according to the present invention.

The passivation blanket 18 and particularly the third layer 24 is planarized using chemical mechanical planarization with any of a variety of slurries. Preferably however the planarization is accomplished using an oxide chemical mechanical planarization process. The chemical mechanical planarization process is well known to those skilled in the art and includes the planarization of the wafer surface (and in particular the passivation blanket 18) by the relative motion between the wafer and a polishing pad and the presence of a slurry while applying pressure between the wafer and polishing pad. The oxide slurry includes ultrafine silica colloidal particles in an alkaline medium of aqueous potassium hydroxide or ammonium hydroxide. The oxide chemical mechanical planarization process produces both local and global planarization of the semiconductor wafer 10 and passivation blanket 18. The planarized wafer is preferably cleaned and scrubbed after the planarization process. FIG. 2 illustrates an apparatus and method for chemical mechanical planarization of the passivated wafer according to the present invention. The passivated wafer 100 and is held by a wafer carrier 102. The passivated wafer 100 is pressed against a polishing pad 104 in the presence of a slurry 108 that is deposited onto the polishing pad 104 by a slurry dispenser 106. The polishing pad 104 may be moved relative to the passivated wafer 100 by a rotating platen 104.

After the semiconductor wafer 10 and passivation blanket 18 have been planarized, another photoresist layer 26 is deposited over the passivation blanket 18 and selectively developed (for example with ultraviolet light and a mask 8) as shown in FIG. 1J. Thereafter, the undeveloped photoresist is removed and the passivation layer 18 is etched down to the contact pad 16. As shown in FIG. 1L, an under bump metal metallurgy 28 is deposited over the passivation blanket 18. The under bump metallurgy 28 may include a plurality of layers of metals and metal alloys each individually deposited, for example, by sputtering. The under bump metallurgy 28 may be any one a variety of combinations of metal and metal alloys depending on whether the bump is a gold, copper, aluminum, solder or nickel, depending upon the process by which the bump is deposited, and depending on the type of metal or alloy for the contact pad. For example, a suitable under bump metallurgy for solder may include Cr—Cu—Au, Ni—Cu, Ti—Cu, TiW—Cu, Ni—Au, Al—NiV—Cu.

After the under bump metallurgy 28 has been deposited on the passivation blanket 18, a third photoresist layer 30 is deposited over the under bump metallurgy 28, and selectively developed as shown in FIG. 1M. The undeveloped portions are removed and the under bump metallurgy 28 is selectively etched to leave an under bump metallurgy 28 over the contact pad 16 and on a portion of the passivation layer 18 as shown in FIG. 1N.

A contact material 32 is deposited onto the under bump metallurgy 28. As indicated earlier the contact material may be gold, copper, aluminum, solder, nickel or other suitable electrical contact material. Preferably the contact material 32 is solder. The solder may be deposited by either evaporation, electroplating, stencil printing, solder jet printing, solder jet printing methods, fly-through solder jet printing methods, micro-punching methods, molten solder injection methods, supersolder methods, microball mounting methods, tacky dot methods, and the like. However, preferably the solder is deposited by stencil printing on to an under bump metallurgy of Ni—Au or Al—NiV—Cu. The solder may include any of a variety of combinations of material including 35–70 weight percent lead and 65–30 weight percent tin. As shown in FIG. 1P, the contact material 32 may be reflown to form a contact bump, thus producing a flip chip. A flip chip made according to the method of the present invention provides excellent adhesion of the under bump metallurgy to the underlying contact pad, particularly aluminum contact pads, and improved resistance to stress fractures.

Figure 3:
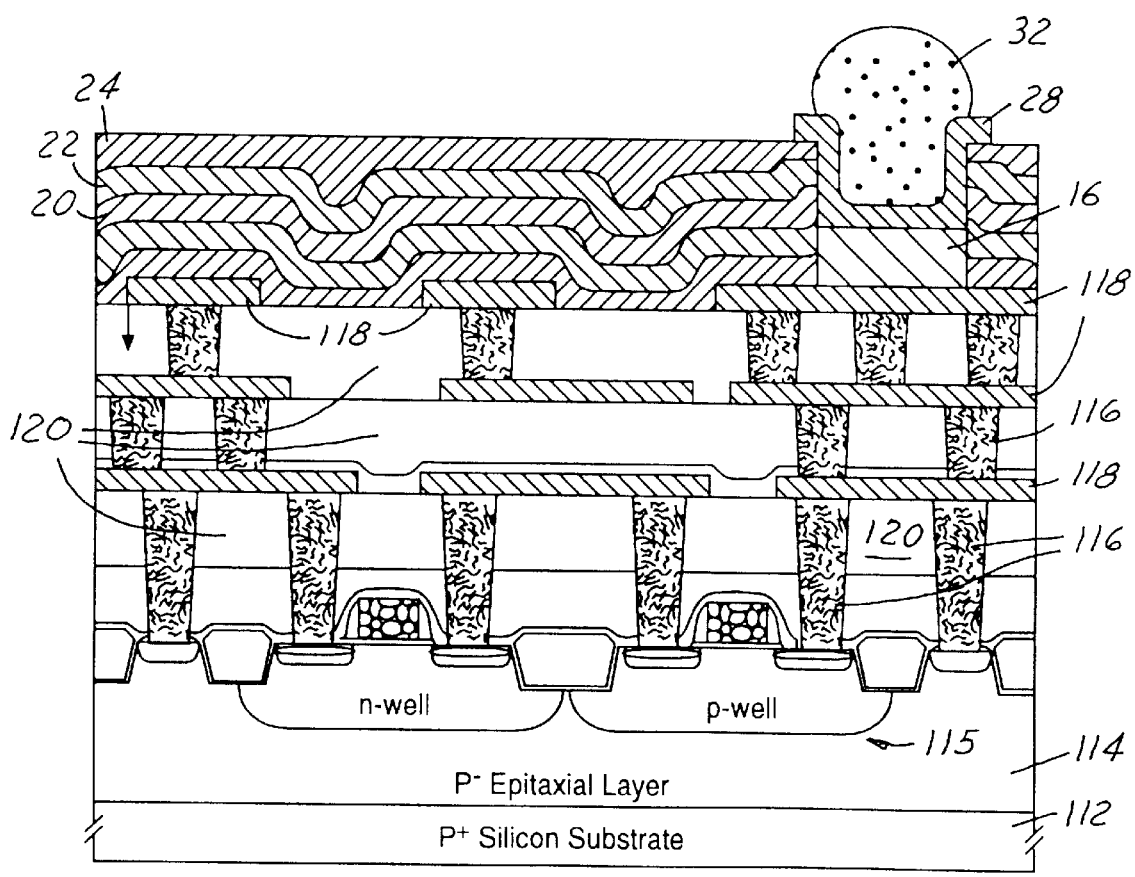
FIG. 3 illustrates a semiconductor device having benzocyclobutene based interlayer dielectric layers and chemical mechanical planarized passivation blanket produced by method according to the present invention.

FIG. 3 illustrates an a semiconductor device made according to the method of the present invention. The semiconductor device includes an a silicon substrate 112, and overlying epitaxial layer 114 with devices 115 formed therein. A plurality of metal plugs 116 are provided with metal interconnect layers 118. The metal interconnect layers 118 and the metal plugs 116 are separated by an interlayer dielectric 120 which and preferably is an organic based material such as a benzocyclobutene based material. Preferably the metal interconnect layers 118 are copper. The device includes the planarized passivation blanket 18 including the first layer 20 of silicon dioxide overlying the contact pad 16, the second layer 22 of silicon nitride overlying the first layer 20, and finally the third layer 24 of silicon dioxide overlying the second layer 22. The under bump metallization 28 is provided over the contact pad 16 and a solder bump 32 is deposited onto the under bump metallization 28. Instead of forming a final passivation layer by repeating the benzocyclobutene based material used for the interlayer dielectric, the present invention deposits the passivation blanket 18 including a final silicon dioxide layer 24, and then chemical mechanical planarizes the passivation blanket. The planarized passivation blanket including a final layer of silicon dioxide can be easily etched to form an opening down to the contact pad. The under bump metallization 28 can be reliably deposited over the contact pad 16 and the passivation blanket 18 to avoid problems associated with depositing an under bump metallization over benzocyclobutene based materials.

What is claimed is:

1. A method comprising:
   providing a semiconductor wafer having at least one contact pad;
   depositing a passivation blanket on the semiconductor wafer and contact pad to provide a passivated wafer;
   chemical mechanical planarizing the passivated wafer;
   opening holes in the planarized wafer down to the contact pads;
   depositing an under bump metallurgy on the contact pad; and
   depositing a contact material onto the under bump metallurgy.

2. A method comprising:
   providing a semiconductor wafer having at least one contact pad;
   depositing a passivation blanket over the semiconductor wafer and contact pad, and wherein the step of depositing a passivation blanket comprising depositing a plurality of layers of material including a final layer comprising silicon dioxide to provide a passivated wafer;
   chemical mechanical planarizing the passivated wafer;
   opening holes in the planarized wafer down to the contact pads;
   depositing an under bump metallurgy on the contact pad; and depositing a contact material on the under bump metallurgy.

3. A method as set forth in claim 2 wherein the contact material comprises solder.

4. A method as set forth in claim 2 further comprising the step of reflowing the solder to provide a solder bump.

5. A method as set forth in claim 2 wherein the contact material is at least one selected from the group consisting of gold, copper, aluminum, nickel, solder and alloys thereof.

6. A method as set forth in claim 2 wherein the final layer consists essentially of silicon dioxide.

7. A method as set forth in claim 6 wherein the final layer of silicon dioxide is deposited by plasma assisted chemical vapor deposition.

8. A method as set forth in claim 6 wherein the step of depositing a plurality of layers of materials comprises depositing a silicon nitride layer.

9. A method as set forth in claim 6 wherein the step of depositing a plurality of layers of material comprises depositing a silicon oxynitride layer.

10. A method as set forth in claim 2 wherein the step of depositing a passivation blanket comprises depositing a first layer comprising silicon dioxide over the semiconductor wafer and contact pad, depositing a second layer over the first layer, and depositing a third layer comprising silicon dioxide over the second layer.

11. A method as set forth in claim 10 wherein the second layer comprises silicon nitride.

12. A method as set forth in claim 10 wherein the first and second layers are deposited by high-density chemical vapor deposition and the third layer is deposited by plasma assisted chemical vapor deposition.

13. A method as set forth in claim 2 wherein the step of chemical mechanical planarizing the passivated wafer comprises globally planarizing the passivated wafer.

14. A method as set forth in claim 2 wherein the step of chemical mechanical planarizing the passivated wafer includes the step of applying pressure to the passivated wafer using a polishing pad in the presence of oxide slurry.

15. A method as set forth in claim 14 wherein the oxide slurry comprises ultrafine silica colloidal particles and an alkaline medium of aqueous potassium hydroxide or ammonium hydroxide.

16. A method as set forth in claim 2 wherein the step of opening holes in the planarized wafer down to the contact pads comprises etching the passivation blanket on the semiconductor wafer.

17. A method comprising:

providing a semiconductor wafer;

forming contact pads on a semiconductor wafer;

depositing a first layer of silicon dioxide over the semiconductor wafer and contact pads;

depositing a layer of silicon nitride over the first layer of silicon dioxide;

depositing a second layer of silicon dioxide over the layer of silicon nitride;

planarizing the semiconductor wafer including at least the second layer of silicon dioxide using oxide chemical mechanical planarization;

opening holes in the second layer of silicon dioxide, layer of silicon nitride, and first layer silicon dioxide down to the contact pad on the semiconductor wafer;

depositing an under bump metallurgy onto the contact pad;

depositing solder onto the under bump metallurgy.

18. A method as set forth in claim 17 further comprising the step of forming the under bump metallurgy onto a portion of the second layer of silicon dioxide.

19. A method as set forth in claim 17 wherein the step of depositing solder comprises stencil printing solder onto the under bump metallurgy.

20. A method as set forth in claim 19 further comprising the step of reflown the solder to form a solder bump on the semiconductor wafer.

21. A method comprising:

providing a semiconductor wafer having at least one contact pad;

depositing a passivation blanket over the semiconductor wafer and contact pad, and wherein the step of depositing a passivation blanket comprises depositing a plurality of layers of material including a final layer comprising silicon dioxide to provide a passivated wafer;

chemical mechanical planarizing the passivated wafer;

opening holes in the passivated wafer down to the contact pad; and depositing a contact material over the contact pad.

22. A method comprising:

providing a semiconductor wafer having at least two metal interconnect layers and a benzocyclobutene based dielectric material between the two metal interconnect layers and having at least one contact pad;

depositing a passivation blanket over the semiconductor wafer and contact pad, and wherein the step of depositing a passivation blanket comprising depositing a plurality of layers of material including a final layer comprising silicon dioxide to provide a passivated wafer;

chemical mechanical planarizing the passivated wafer;

opening holes in the planarized wafer down to the contact pad;

depositing an under bump metallurgy on the contact pad; and depositing a contact material on the under bump metallurgy.

23. A method as set forth in claim 22 wherein the step of depositing a plurality of layers of materials includes depositing a first layer of silicon dioxide over the semiconductor wafer and the contact pad.

24. A method as set forth in claim 23 wherein the step of depositing a plurality of layers of materials includes depositing a silicon nitride layer over the first layer of silicon dioxide.

25. A method as set forth in claim 24 wherein the step of depositing the first layer silicon dioxide and the silicon nitride layer are accomplished using high-density chemical vapor deposition.

26. A method as set forth in claim 25 wherein the step of depositing the final layer of silicon dioxide is accomplished using plasma assisted chemical vapor deposition.

* * * * *